(12) United States Patent
Dances

(10) Patent No.: US 6,659,328 B2
(45) Date of Patent: Dec. 9, 2003

(54) METHOD AND APPARATUS FOR DEPOSITION OF SOLDER PASTE FOR SURFACE MOUNT COMPONENTS ON A PRINTED WIRING BOARD

(75) Inventor: Robert J. Dances, Torrance, CA (US)

(73) Assignee: Xerox Corporation, Stamford, CT (US)

( * ) Notice: Subject to any disclaimer, the term of this patent is extended or adjusted under 35 U.S.C. 154(b) by 22 days.

(21) Appl. No.: 10/017,598

(22) Filed: Dec. 18, 2001

(65) Prior Publication Data

US 2003/0111518 A1 Jun. 19, 2003

(51) Int. Cl.[7] .................................................. B23K 3/06
(52) U.S. Cl. ................................................. 228/22; 228/39
(58) Field of Search .......................... 228/248.1, 248.5, 228/33, 35, 39, 22

(56) References Cited

U.S. PATENT DOCUMENTS

| | | | | |
|---|---|---|---|---|
| 4,135,020 A | * | 1/1979 | Maxwell ..................... 428/131 |
| 4,891,738 A | * | 1/1990 | Richardson et al. ........ 362/282 |
| 4,953,460 A | * | 9/1990 | Wojcik ........................ 101/129 |
| 5,254,362 A | | 10/1993 | Shaffer et al. ................ 427/96 |
| 5,740,730 A | * | 4/1998 | Thompson, Sr. ............. 101/127 |
| 6,092,463 A | * | 7/2000 | Onishi et al. ................ 101/129 |
| 6,095,041 A | * | 8/2000 | Comino et al. ............. 101/127 |
| 6,237,490 B1 | * | 5/2001 | Takahashi et al. .......... 101/129 |
| 6,264,862 B1 | * | 7/2001 | Liaw ........................... 264/102 |
| 6,276,055 B1 | * | 8/2001 | Bryan et al. ................. 29/852 |
| 6,316,289 B1 | | 11/2001 | Chung ......................... 438/118 |

* cited by examiner

Primary Examiner—Kiley Stoner
(74) Attorney, Agent, or Firm—William Propp

(57) ABSTRACT

A method and apparatus for depositing solder paste on a printed wiring board has a stencil with a pattern of multiple apertures. The pattern aligns with a through-hole in the printed wiring board when the stencil is in physical contact with the printed wiring board. A squeegee arrangement applies solder paste through the multiple apertures in the stencil through the through-hole of the printed wiring board to the upper surface of the printed wiring board for securely mounting electronic components to the upper surface of the printed wiring board, for providing a thermal path for the heat sinks of the electronic components and for providing a low inductance electrical path to ground for the electrical components.

6 Claims, 3 Drawing Sheets

METHOD AND APPARATUS FOR DEPOSITION OF SOLDER PASTE FOR SURFACE MOUNT COMPONENTS ON A PRINTED WIRING BOARD

BACKGROUND OF THE INVENTION

The present invention relates to deposition of solder paste for surface mounted components on a printed wiring board (PWB) and, more particularly, to an aperture pattern for the deposition of solder paste through the opposite surface of a printed wiring board for surface mounted components.

A printed wiring board is a flat plate or base of insulating material containing a pattern of conducting material. The patterned conducting material form traces which electrically connect electronic components mounted on the surface of the printed wiring board to form circuits. The surface mounted components are any of the basic electronic parts used in forming a circuit such as resistors, capacitors, DIP, integrated circuits and the like.

The patterned conducting material in addition to forming connective traces also forms pads, conductive areas on the surface of the printing wiring board. Pads are provided on the printed wiring board so that connection can be made to the surface mounted components. The electronic components are then mounted to the appropriate pre-determined points on the conductive trace and pad pattern on the surface of the printed wiring board. Single layer printed wiring boards have all the conductors, the traces, pads and surface mounted components on one side of the board.

In one method of mounting the electronic components on the surface of the printed wiring board, the pads can have through-holes formed from the pad through the printed wiring board. Each through-hole is coated with a conductive material along the walls of the hole. The electronic components will have connection pins which are inserted in the through-holes on the pads and then reflow soldered into position on the pads with their connective traces to the rest of the circuit.

Alternately, electronic components can be mounted on the surface of the printed wiring board using solder paste deposited through a stencil in a desired pattern on the printed wiring board.

The solder paste is deposited by a screen printing process using the stencil. A typical stencil will be fabricated from stainless steel foil having a thickness of the order of 0.005 or 0.006 inches (5 or 6 mils). Apertures are formed in the stencil at positions and shapes corresponding to the required component mounting pads on the printed wiring board. The stencil is precisely aligned in physical contact with the upper surface of the printed wiring board and held firmly together with the printed wiring board.

Solder paste is applied to the upper surface of the stencil. A squeegee is then drawn through the solder paste and over the entire stencil and the solder paste is pushed into each of the apertures of the stencil and forced through the apertures onto the printed wiring board to form the solder component mounting pads on the upper surface of the printed wiring board.

The surface mounted component itself will have contact pads or contact points. The electronic components are subsequently placed onto the printed wiring board with their contact pads mating with printed wiring board pad patterns onto which the solder paste has been precisely stenciled. The printed wiring board with electronic components thereon, then passes through an oven where the solder is melted or reflowed, thereby fusing the electronic component contact pads with the mating printed wiring board pads.

Although use of surface mounted components generally offers high circuit densities, such components generally have significantly less mechanical strength in terms of their physical connection to the printed wiring board than components mounted by means of plated through-holes.

An additional problem with components mounted on the surface of a printed wiring board is the heat sink for a component is typically mounted on the component between the component and the printed wiring board. This heat sink position provides a poor thermal path for dissipation of heat from the heat sink.

A further problem for components mounted on the surface of a printed wiring board is providing a low inductance electrical path to ground within the printed wiring board.

It is an object of this invention to provide a method and apparatus for deposition of solder paste for securely mounting electronic components on a printed wiring board.

It is another object of this invention to provide a method and apparatus for deposition of solder paste from the opposite surface of a printed wiring board for securely mounting electronic components on a surface of the printed wiring board.

It is yet another object of this invention to provide a thermal path for dissipation of heat from a heat sink attached to a surface mounted component from the opposite surface of a printed wiring board.

It is yet another object of this invention to provide a low inductance electrical path to ground within the printed wiring board for the component mounted on the surface of the printed wiring board.

SUMMARY OF THE INVENTION

According to the present invention, a method and apparatus for depositing solder paste on a printed wiring board has a stencil with a pattern of multiple apertures. The pattern aligns with a through-hole in the printed wiring board when the stencil is in physical contact with the printed wiring board. A squeegee arrangement applies solder paste through the multiple apertures in the stencil through the through-hole of the printed wiring board to the lower surface of the printed wiring board for mounting electronic components to the lower surface of the printed wiring board.

The circular pattern of the multiple apertures aligns with the circular through-hole. The identical triangular shape and symmetrical pattern of the apertures forces the solder paste against the wall of the through-hole.

The resulting annular ring solder pattern in the through-hole from the opposite surface of the printed wiring board securely mounts the component to the printed wiring board, provides a low inductance electrical path to ground in the printed wiring board, and provides a superior thermal path for the heat sink of a surface mounted component.

Other objects and attainments together with a fuller understanding of the invention will become apparent and appreciated by referring to the following description and claims taken in conjunction with the accompanying drawings.

DESCRIPTION OF THE INVENTION

Figure 1:
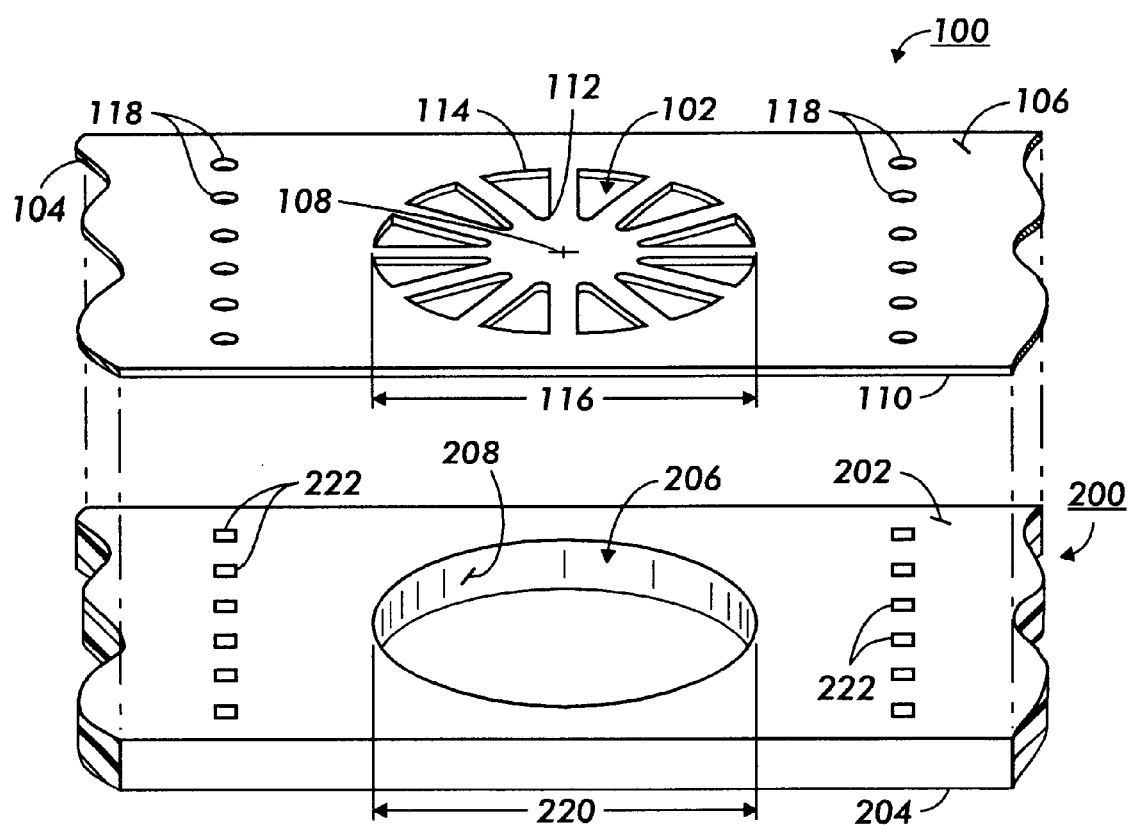
FIG. 1 is a perspective view of the upper surface of the stencil with multiple apertures in a circular pattern and the lower surface of the printed wiring board with a plated through-hole for the deposition of solder paste through the opposite surface of a printed wiring board for a component mounted on the upper surface of the printed wiring board of the present invention.

Reference is now made to FIG. 1, wherein there is illustrated the stencil 100 with multiple apertures 102 for the deposition of solder paste through a through-hole to the opposite surface of a printed wiring board for mounting an electronic component in accordance with this invention.

In the perspective view of FIG. 1, the stencil 100 includes a thin metal sheet 104 having a plurality of apertures 102 therethrough arranged in a circular pattern corresponding to the pattern of solder paste to be deposited through a through-hole on the printed wiring board 200. The thin metal sheet 104 may be a sheet or membrane of brass, steel, stainless steel (magnetic or non-magnetic), carbon steel, nickel alloy, iron alloy molybdenum, titanium or other high-strength metal, their alloys, and laminates of sheets thereof. The single layer plain surface stencil 100 is fabricated from a suitable material such as rolled stainless steel foil having a thickness of typically 5 to 6 mils (1 mil=0.001 inches). The rolling process used to form such stencils produces a hard flat polished upper surface 106 and uniform stencil thickness.

The plurality of apertures 102 are arranged in a circular symmetrical pattern on the stencil 100 around a center point 108 and each aperture extends from the upper surface 106 of the stencil 100 through the stencil to the lower surface 110 of the stencil 100. The apertures 102 are identical isosceles triangular in shape with the narrow point 112 of the aperture closest to the center point 108. The triangular aperture increasing in width with radial distance from the center point. The widest point 114 of the aperture 102 is farthest from the center point 108. Each aperture in the circular pattern is equidistant radially from the center point 108 and each aperture is equally spaced from the adjacent apertures. The circular pattern of apertures 102 will have a diameter 116 at the widest point 114 of the triangular apertures 102 which is the farthest radial distance from the center point 108 of the circular pattern.

The metal sheet 104 of stencil 100 may be fabricated by at least three methods that are capable of producing apertures 102 from thin metal stencils with suitable resolution to produce fine features at fine pitch over areas as large as a printed wiring board. In general, the fabrication method producing the finest feature dimension will ordinarily also produce the lowest tolerance dimension associated with physical position over the area of the stencil.

The lowest cost method for fabricating apertures 102 in the metal sheet 104 of stencil 100 is conventional photo-etching of the sort commonly employed for fabricating thick film circuits and depositing solder paste. In this method, a photosensitive layer is first deposited onto a thin metal sheet, such as brass or stainless steel sheet, and is then exposed to form, for example, a cross-linked polymer. A pattern of openings, corresponding to the pattern of apertures 102, is made in the photosensitive layer by areas which are left unexposed and are then washed away by a solvent to expose the metal sheet 104 underneath, leaving the rest of the metal sheet 104 protected by the exposed photosensitive layer. An acid or other etching chemical is applied to etch away those exposed areas of metal sheet 104 to form apertures 102 therethrough in the pattern of apertures 102. The current state of photo-etching technology is able to produce a pattern of 125-micron openings in metal sheets having a thickness of 50 microns or more.

A second method of fabricating apertures 102 in metal sheet 104 of stencil 100 that is cost effective employs laser machining. A beam produced by a high power laser having a fine beam focus is used to heat up those areas of the metal sheet 104 at which openings, corresponding to the pattern of apertures 102, are to be made and the energy of the laser beam vaporizes or evaporates away the metal to form apertures in the metal sheet 104. The energy level of the laser beam is selected to be sufficient to vaporize the material to be removed in a controlled fashion, but is not so high as to damage surrounding areas of the material of the metal sheet 104 of stencil 100. Laser machining technology can currently machine apertures having dimensions of less than 10 microns, but at higher cost than that of photo-etching.

The most precise apertures may be achieved by a third method known as electroforming. In this technique, the same photo-resist materials that are used in conventional semiconductor wafer processing are used to form the fine apertures 102, and electroplating or electroforming or electro-depositing is used to build up a thin metal sheet 104. Precision openings having a dimension as fine as 2.5 microns have been fabricated by electroforming.

Other methods, such as screen emulsion and die cutting, may also be employed. Combinations of two or three of the foregoing techniques may be employed for better cost effectiveness, such as where both fine and larger apertures are to be formed in the same metal sheet.

Figure 2:
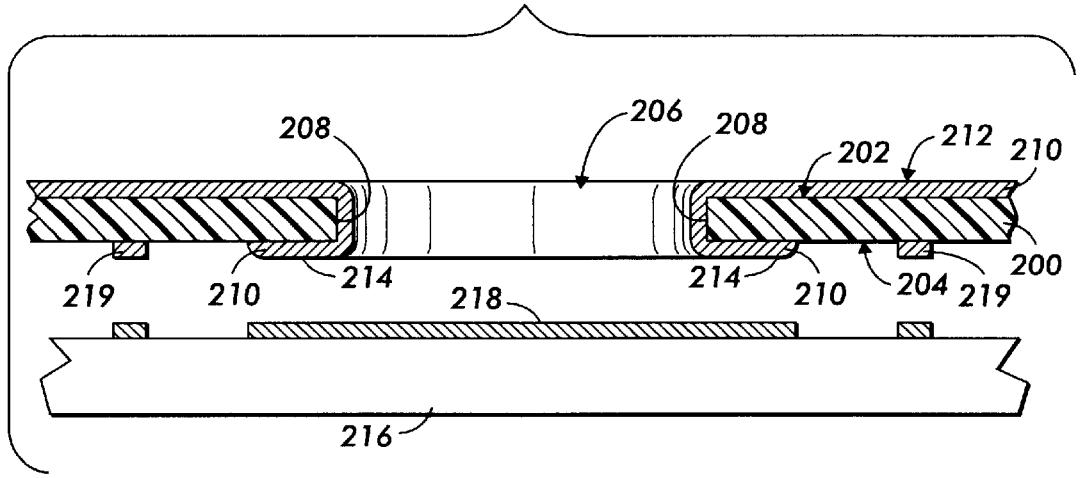
FIG. 2 is a side view of the printed wiring board with a plated through-hole for the deposition of solder paste through the opposite surface of a printed wiring board for a component mounted on the upper surface of the printed wiring board of FIG. 1.

As shown in the perspective view of FIG. 1 and the side view of FIG. 2, the printed wiring board 200 has a lower surface 202 and an upper surface 204. The lower surface 202 of the printed wiring board 200 is adjacent to the lower surface 110 of the stencil 100. A circular through-hole 206 extends from the lower surface 202 of the printed wiring board 200 through the printed wiring board to the upper surface 204 of the printed wiring board 200. The through-hole 206 is plated on the hole walls 208 with a metal coating 210, preferably copper, and the coating 210 extends along the lower surface 202 of the printed wiring board 200 to form a lower pad 212. The coating 210 also extends along the upper surface 204 of the printed wiring board 200 to form an upper pad 214.

The electronic component 216 to be mounted on the upper surface 204 of the printed wiring board 200 has a heat sink 218 on its lower surface. The heat sink 218 aligns with the upper pad 214 of the printed wiring board. The electronic component 216 is centered around the through-hole 206. The electronic component 216 and the upper surface 204 of the printed wiring board 200 may have additional pads 219 to be connected the printed wiring board 200.

As shown in FIG. 1, the diameter 220 of the through-hole 206 of the printed wiring board 200 is approximately the same as the diameter 116 of the circular pattern of the apertures 102 of the stencil 100, specifically the widest points 114 of the apertures 102 farthest from the center point 106 of the circular pattern. The circular pattern of apertures 102 of the stencil 100 will be aligned with the through-hole 206 of the printed wiring board 200 by alignment holes 118 on the stencil 100 and alignment holes 222 on the printed wiring board 200.

Figure 3:
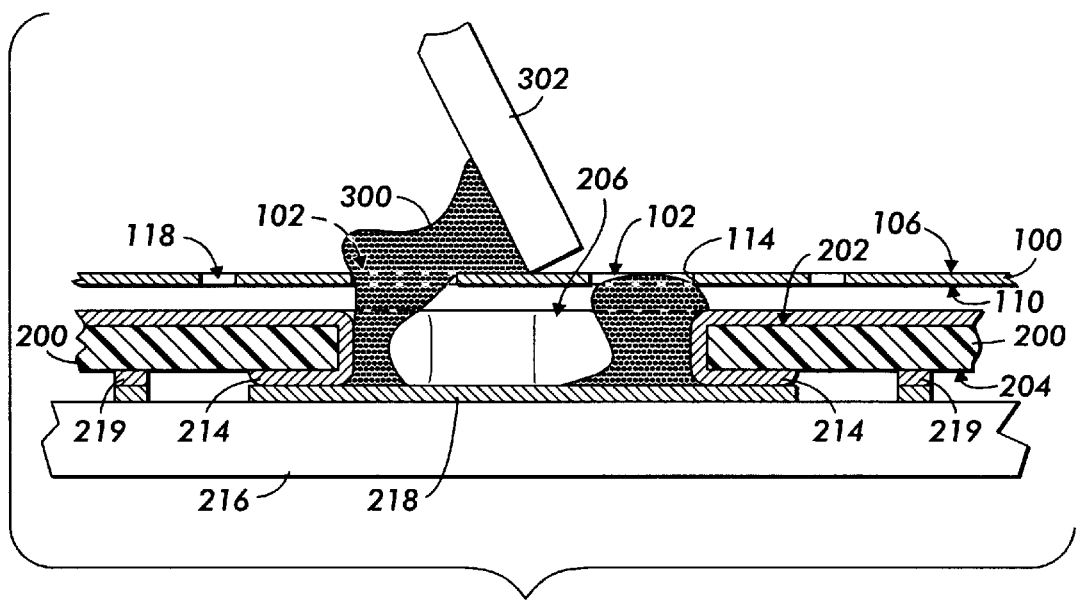
FIG. 3 is a side view of deposition of solder paste through the stencil with multiple apertures from the opposite surface of the printed wiring board through the plated through-hole of the printed wiring board to the component mounted on the upper surface of the printed wiring board of the present invention.

The stencil 100 is aligned and placed in physical contact with the printed wiring board 200 at their edges by a frame (not shown) in FIG. 3. The lower surface 110 of the stencil 100 will be in physical contact with the lower surface 202 of the printed wiring board 200. The other contact pads 219 for the electronic component 216 can already be bonded to the upper surface 204 of the printed wiring board 200.

Solder paste 300 is applied to the upper surface 106 of the stencil 100. A squeegee blade 302 moves across the upper surface 106 forcing the solder paste 300 into the apertures 102 of the stencil 100. The solder paste 300 flows through the apertures 102 out the lower surface 110 of the stencil 100, to be deposited along the walls 208 of the through-hole 206 in the printed wiring board 200 and to be deposited between the lower pad 214 on the upper surface 204 of the printed wiring board 200 and the heat sink 218 of the electronic component 216.

The size and shape of the aperture 102 and the movement of the squeegee blade 302 controls the amount of solder paste 300 deposited between the lower pad 214 on the upper surface 204 of the printed wiring board 200 and the heat sink 218 of the electronic component 216. In effect, the apertures act as an extruding orifice through which a defined amount of solder paste is extruded between the contact pads of the printed wiring board and the electronic component.

The triangular shape of the aperture 102 with the widest side 114 of the triangular aperture 102 closest to the wall 208 of the through-hole 206 forces the deposited solder paste 300 down the wall 208 and between the printed wiring board 200 and the electronic component 216.

The length of the aperture 102 along the radial distance towards the center point 108 and the decreasing width of the aperture 102 provides additional solder paste 300 along the wall 208 of the through-hole 206 and between the printed wiring board 200 and the electronic component 216. The solder paste 300 along the narrower width of the aperture 102 farther away from the wall 208 of the through-hole 206 will be forced through the aperture 102 by the squeegee blade 302 and droop back against the wall 208 and between the printed wiring board 200 and the electronic component 216.

Unlike the prior art solder deposition methods and apparatuses, the deposited solder paste of the present invention does not take the shape of the aperture. A simple circular aperture, instead of the present invention, would deposit solder paste through the through-hole onto the electronic component with an excessive amount of solder paste providing an ineffective bond between the component and the printed wiring board.

The circular symmetrical pattern of multiple identical apertures arranged at a fixed radial distance in a fixed angular configuration provides an effective secure bond between the electronic component and the printed wiring board.

The apertures 102 need not be triangular in shape. The only shape requirement is that the apertures be identical and symmetrical around the center point to provide a uniform deposition of solder paste. The shape of the apertures can be tear-drop, elliptical, rectangular or even circular. The diameter 116 of the circular pattern of the multiple apertures 102 should match the diameter 220 of the circular through-hole 206.

Figure 4:
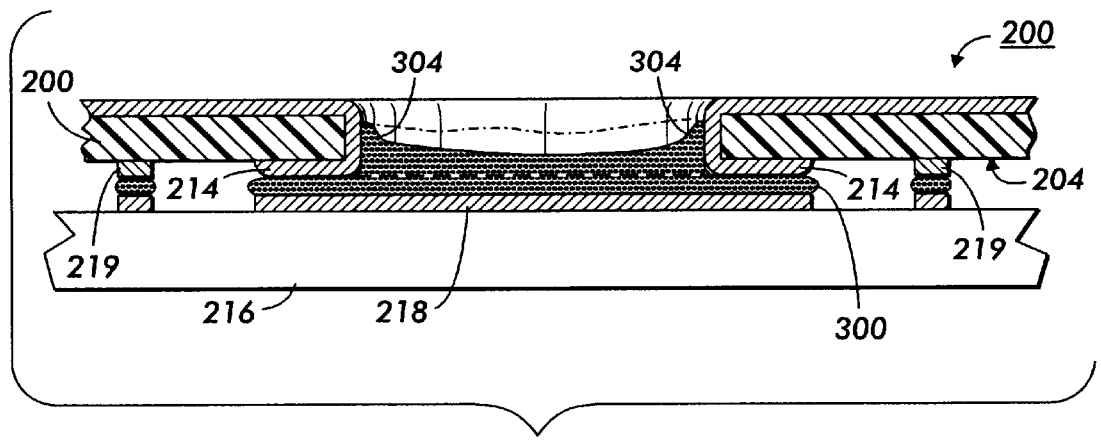
FIG. 4 is a side view of the component mounted on the upper surface of the printed wiring board of the present invention.

As shown in FIG. 4, after the stencil 100 is removed, the printed wiring board 200 and the component 216 are then heated, the solder paste 300 melts and reflows into position. The solder paste 300 fuses the lower pad 214 on the lower surface 204 of the printed wiring board 200 and the heat sink 218 of the electronic component 216 and forms an annular ring 304 around the circular wall of the through-hole and the electronic component.

The screening deposition equipment suitable for use in conjunction with the present invention includes a mechanism for supporting the printed wiring board and the stencil and the electronic components to be mounted, for deposition of the solder paste, for driving the squeegee blade, and for heating and reflow of the solder paste in mounting the electronic component.

The present invention provides an even application of solder paste to securely fasten a surface mounted electronic component to a printed wiring board. The solder paste is deposited through a stencil with a circular symmetrical pattern of identical triangular apertures through a through-hole on the surface of the printed wiring board opposite the surface of the printed wiring board that the electronic components is to be mounted. As a result of this apparatus and method, surface mounted electronic components are more firmly and securely held to the printed wiring board.

The annular solder ring 304 through the through-hole 206 to the lower surface 202 of the printed wiring board 200 provides a superior thermal path for heat dissipation from the heat sink 218 of the surface mounted component 216.

The annular solder ring 304 through the through-hole 206 from the lower surface 202 of the printed wiring board 200 to the upper surface 204 of the printed wiring board 200 also provides a low inductance electrical path to the ground layer (not shown in Figure) within a multiple layer printed wiring board 200 for the surface mounted component 216.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. An apparatus for deposition of solder paste on a printed wiring board comprising:
   a stencil having a plurality of apertures through two planar surfaces, said two planar surfaces being an upper surface and a lower surface;
   said printed wiring board having a through-hole through two planar surfaces, said two planar surfaces being an upper surface and a lower surface;
   said lower surface of said stencil placed in contact with said lower surface of said printed wiring board, said plurality of apertures of said stencil aligned with said through-hole of said printed wiring board;
   said solder paste being applied on said upper surface of said stencil;
   squeegee application means for depositing said solder paste through said plurality of apertures of said stencil through said through-hole of said printed wiring board to said upper surface of said printed wiring board, said squeegee application means being in contact with said upper surface of said stencil and with said solder paste; and a surface-mounted electronic component being attached to said depositions of said solder paste on said upper surface of said printed wiring board wherein said plurality of apertures are in a circular pattern, said through-hole is circular, said circular pattern of said plurality of apertures of said stencil aligned with said circular through-hole of said printed wiring board.

2. The apparatus for deposition of solder paste on a printed wiring board of claim 1 wherein each of said plurality of apertures is identical in shape and each of said plurality of apertures is arranged symmetrically around said circular pattern.

3. The apparatus for deposition of solder paste on a printed wiring board of claim 2 wherein each of said plurality of apertures is triangular in shape.

4. The apparatus for deposition of solder paste on a printed wiring board of claim 1 wherein said stencil is formed from the group including steel, carbon steel, stainless steel, magnetic stainless steel, nickel alloy, iron alloy, molybdenum, titanium and alloys, combinations and laminations thereof.

5. The apparatus for deposition of solder paste on a printed wiring board of claim 1 wherein said plurality of apertures are formed in said stencil by at least one method of photo-etching, laser machining, electroforming, or die cutting.

6. The apparatus for deposition of solder paste on a printed wiring board of claim 1 wherein a heat sink of said surface-mounted electronic component is attached to said depositions of said solder paste on said upper surface of said printed wiring board.

* * * * *